United States Patent
Okamoto et al.

(10) Patent No.: US 8,022,773 B2
(45) Date of Patent: Sep. 20, 2011

(54) CLOCK SIGNAL GENERATION DEVICE, AND WIRELESS BASE STATION

(75) Inventors: Keiji Okamoto, Tokyo (JP); Kuniyuki Suzuki, Tokyo (JP); Michio Orita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 237 days.

(21) Appl. No.: 11/721,781

(22) PCT Filed: Dec. 17, 2004

(86) PCT No.: PCT/JP2004/018910
§ 371 (c)(1),
(2), (4) Date: Sep. 17, 2007

(87) PCT Pub. No.: WO2006/064572
PCT Pub. Date: Jun. 22, 2006

(65) Prior Publication Data
US 2008/0106342 A1    May 8, 2008

(51) Int. Cl.
*H03L 7/085* (2006.01)
*H04M 1/00* (2006.01)

(52) U.S. Cl. ............. 331/16; 331/17; 331/18; 331/64; 455/561

(58) Field of Classification Search ............. 331/16–18, 331/64, 177 R; 455/561
See application file for complete search history.

(56) References Cited

U.S. PATENT DOCUMENTS

| | | | |
|---|---|---|---|
| 4,642,805 A * | 2/1987 | Dumas et al. ............. | 370/359 |
| 5,699,392 A | 12/1997 | Dokic | |
| 5,727,034 A | 3/1998 | Ojaniemi | |
| 5,875,388 A * | 2/1999 | Daughtry et al. .......... | 455/67.11 |
| 6,239,627 B1 * | 5/2001 | Brown et al. ............... | 327/116 |
| 6,271,736 B1 | 8/2001 | Kim | |
| 6,816,019 B2 * | 11/2004 | Delbo' et al. ............... | 331/17 |
| 6,873,670 B1 * | 3/2005 | Chiu ............................ | 375/375 |

FOREIGN PATENT DOCUMENTS

CN    85 1 06845 A    3/1987
(Continued)

OTHER PUBLICATIONS

3 GPP TS 25.141 V3. 13.0, $3^{RD}$ Generation Partnership Project; Technical Specification Group Radio Access Network; Base Station (BS) Conformance Testing (FDD) (Release 1999), Technical Specification, pp. 34-35, 2003.

(Continued)

*Primary Examiner* — Levi Gannon
(74) *Attorney, Agent, or Firm* — Oblon, Spivak, McClelland, Maier & Neustadt, L.L.P.

(57) ABSTRACT

A wireless base station (11) includes a wireless communication unit (17) and a clock signal generation unit (20). The clock signal generation unit (20) includes a voltage-controlled oscillation unit (21) that outputs a clock signal of an oscillating frequency according to an inputted control voltage, a time information generation unit (22) that generates time information based on the clock signal, a time information comparison unit (23) that compares the time information with reference time information; and a control voltage instruction unit (24) that instructs a control voltage according to the comparison result to the voltage-controlled oscillation unit (21). Accordingly, the oscillating frequency of the clock signal can be kept easily and highly precisely.

7 Claims, 8 Drawing Sheets

FOREIGN PATENT DOCUMENTS

| | | |
|---|---|---|
| CN | 1159263 A | 9/1997 |
| JP | 63 77202 | 4/1988 |
| JP | 4 61421 | 2/1992 |
| JP | 6 29737 | 2/1994 |
| JP | 7 23484 | 1/1995 |
| JP | 8 509346 | 10/1996 |
| JP | 2000 278045 | 10/2000 |
| JP | 2001 77670 | 3/2001 |
| JP | 2002 544623 | 12/2002 |
| KR | 2002-0041555 | 6/2002 |
| WO | WO 2004/045197 A2 | 5/2004 |

OTHER PUBLICATIONS

3 GPP TS 25.427 V3.11.0, $3^{RD}$ Generation Partnership Project; Technical Specification Group Radio Access Network; UTRAN Lub/Lur Interface User Plane Protocol for DCH Data Streams (Release 1999), Technical Specification, pp. 12 and 26, 2003.

3 GPP TS 25.435 V3.11.0, $3^{RD}$ Generation Partnership Project; Technical Specification Group Radio Access Network; UTRAN Lub Interface User Plane Protocols for Common Transport Channel Data Streams (Release 1999), Technical Specification, pp. 11-12 and 30-31, 2003.

* cited by examiner

| Reference time information | 2005.10.9 | 7:14:25.000 |
|---|---|---|

| Calendar information | 2005.10.9 | 7:14:25.010 |
|---|---|---|

CLOCK SIGNAL GENERATION DEVICE, AND WIRELESS BASE STATION

TECHNICAL FIELD

The present invention relates to a clock signal generation device that generates clock signals, and to a wireless base station employing the device.

BACKGROUND ART

A clock signal generation device applied to a mobile communication terminal has been used, in which, even if the reference frequency is shifted due to aging variation, by overwriting to update the initial parameter table with a parameter at the time of convergence by feedback control, or more specifically, a parameter corresponding to the reference frequency following the transmission frequency of the base station, even during the initial oscillation period at the next start-up, the reference frequency that follows the transmission frequency of the base station from the start is obtained (see, for example, Patent document 1). For example, in a mobile phone system using 800 MHz band, the following precision of a mobile communication terminal to the base station is required to be smaller than 1.5 ppm, and the precision must be smaller than 2 ppm in 1.5 GHz band mobile phone system.

In the meantime, the precision of ±0.05 ppm is required for the oscillating frequency of clock signal generation devices applied to wireless base stations for W-CDMA (wideband code division multiple access) for example, as described in Non-patent document 1 in 3GPP TS (3rd Generation Partnership Project Technical Specification) being a third-generation mobile phone standard.

[Patent document 1]: Japanese Laid-open Patent Publication 077670/2001 (paragraphs 0013 through 0020, and FIG. 1 and FIG. 3)
[Patent document 2]: Japanese Laid-Open Patent Publication 509346/1996
[Non-patent document 1]: 3GPP TS 25.141 (6.3 Frequency Error)
[Non-patent document 2]: 3GPP TS 25.427 (Node Synchronization)
[Non-patent document 3]: 3GPP TS 25.435 (Node Synchronization)

DISCLOSURE OF THE INVENTION

Problem that the Invention is to Solve

However, in a case in which, as IP (Internet Protocol) networks, a clock signal generation device requiring a precise oscillating frequency such as ±0.05 ppm is connected to only a wired line where the clock signal frequency precision is not assured and cannot follow the transmission clock, the device can only to use an extremely expensive rubidium oscillator, to use a GPS (Global Positioning System) that limits the installation location, or to use a precise OCXO (oven-controlled crystal oscillator) up to around three years and then to exchange or recalibrate it.

An object of the present invention is to provide a clock signal generation device and a wireless base station that are capable of keeping clock signal oscillating frequencies easily and highly precisely.

Means for Solving the Problem

A clock signal generation device or a clock signal generation means in a wireless base station according to the present invention includes a voltage-controlled oscillation unit that outputs a clock signal of an oscillating frequency according to an inputted control voltage; a time information generation unit that generates time information based on the clock signal outputted from the voltage-controlled oscillation unit; a time information comparison unit that compares the time information generated by the time information generation unit with reference time information; and a control voltage instruction unit that instructs a control voltage according to the comparison result obtained by the time information comparison unit to the voltage-controlled oscillation unit.

A clock signal generation device according to the present invention includes an always operating oscillation unit that operates at all times, and outputs a clock signal of an oscillating frequency according to an inputted control voltage; a discontinuously operating oscillation unit that can be switched between operating and non-operating states, and outputs a clock signal of a predetermined oscillating frequency; a power control unit that controls a power source for driving the discontinuously operating oscillation unit; a phase comparison unit that compares a phase of the clock signal outputted from the always operating oscillation unit with a phase of a reference clock signal outputted from the discontinuously operating oscillation unit; and a control voltage instruction unit that instructs a control voltage according to the comparison result obtained by the phase comparison unit to the always operating oscillation unit A clock signal generation device according to the present invention includes a plurality of redundant systems, each system having a discontinuously operating oscillation unit that can be switched between operating and non-operating states, and outputs a clock signal of a predetermined oscillating frequency, or of an oscillating frequency according to an inputted control voltage; a power driving unit that controls a power source for driving the discontinuously operating oscillation unit; a phase comparison unit that compares a phase of the clock signal outputted from the discontinuously operating oscillation unit with a phase of a clock signal in another system; and a control voltage instruction unit that instructs a control voltage according to the comparison result obtained by the phase comparison unit to the voltage-controlled oscillation unit.

A clock signal generation device according to the present invention includes a voltage-controlled oscillation unit that outputs a clock signal of an oscillating frequency according to an inputted control voltage; a time information generation unit that generates time information based on the clock signal outputted from the voltage-controlled oscillation unit; an aging-variation information storage unit that stores information representing a relation between the oscillating frequency of the voltage-controlled oscillation unit that varies across ages and a control voltage; and a control voltage instruction unit that instructs based on information stored in the aging-variation information storage unit a control voltage according to the time information generated by the time information generation unit to the voltage-controlled oscillation unit.

A clock signal generation device includes a voltage-controlled oscillation unit that outputs a clock signal of an oscillating frequency according to a set voltage that has been externally designated; a time information generation unit that generates time information based on the clock signal outputted from the voltage-controlled oscillation unit; an aging-variation information storage unit that stores information representing a relation between the oscillating frequency of the voltage-controlled oscillation unit that varies across ages and a set voltage; and a set voltage notification unit that notifies outside, based on information stored in the aging-variation information storage unit, of need for setting change to a set voltage according to the time information generated by the time information generation unit.

A wireless base station according to the present invention includes a clock signal generation means that generates a clock signal; and a wireless communication means that performs wireless communication with a mobile communication terminal using the clock signal generated by the clock signal generation means; wherein the clock signal generation means includes a voltage-controlled oscillation unit that outputs a clock signal of an oscillating frequency according to an inputted control voltage; a phase comparison unit that compares a phase of the clock signal outputted from the voltage-controlled oscillation unit with a phase of a reference clock signal received from a mobile communication terminal that can supply a clock signal; and a control voltage instruction unit that instructs a control voltage according to the comparison result obtained by the phase comparison unit to the voltage-controlled oscillation unit.

Effects of the Invention

According to the present invention, the time information generated on the basis of the clock signal outputted from the voltage-controlled oscillation unit is compared with the reference time information on which aging variation does not affect, and instructs a control voltage according to the comparison result to the voltage-controlled oscillation unit to correct the oscillating frequency of the voltage-controlled oscillation unit, so that the oscillating frequency of the clock signal can be kept easily and highly precisely.

Moreover, according to the present invention, the oscillating frequency of the voltage-controlled oscillation unit is corrected using, as a comparison target of the phase of the always operating oscillation unit, the phase of the discontinuously operating oscillation unit, on which aging variation little affects, so that the oscillating frequency of the clock signal can be kept easily and highly precisely.

Furthermore, according to the present invention, in a redundantly configured clock signal generation device, the phase of the discontinuously operating oscillation unit in the operating system is compared with the phase of the discontinuously operating oscillation unit in the waiting system, so that, the discontinuously operating oscillation unit in the waiting system can be in non-operating state while the phase comparison is not performed. Therefore, the aging variation of the discontinuously operating oscillation unit can be suppressed, so that the oscillating frequency of the clock signal can be kept easily and highly precisely.

Moreover, according to the present invention, the relation between the oscillating frequency that varies across ages and the control voltage is stored, and, when a predetermined time has passed, the control voltage according to the time is instructed to correct the oscillating frequency, so that the oscillating frequency of the clock signal can be kept easily and highly precisely.

Moreover, according to the present invention, the relation between the oscillating frequency that varies across ages and the set voltage is stored, and, when a predetermined time has passed, the set voltage according to the time is notified of to request correction of the oscillating frequency, so that the oscillating frequency of the clock signal can be kept easily and highly precisely.

Furthermore, according to the present invention, the phase of the clock signal supplied by the mobile communication terminal is compared with the phase of the voltage-controlled oscillation unit, so that the oscillating frequency of the clock signal can be kept easily and highly precisely.

Description of the Symbols

11 Wireless base station
12 Base station control device
13 Time information server
14 Gateway
16 Wired communication unit
17 Wireless communication unit
20 Clock signal generation unit (Embodiment 1 and 2)
21 Voltage-controlled oscillation unit
22 Time information generation unit
23 Time information comparison unit
24 Control voltage instruction unit
25 Control unit
26 DA conversion unit
27 Storage unit
28 Time information reception unit
$\Delta f$ Frequency shift
$\Delta fa$ Tolerance range
$\Delta fc$ Correction step
$\Delta ft$ Threshold
$C(\Delta f)$ Curved line
30 Clock signal generation unit (Embodiment 3)
31 Always operating oscillation unit
32 Discontinuously operating oscillation unit
33 Phase comparison unit
34 Control voltage instruction unit
35 Power control unit
40 Clock signal generation unit (Embodiment 4)
41 Control voltage instruction unit
50 Clock signal generation unit (Embodiment 5)
51 Wireless clock extraction unit
60 Mobile communication terminal

BEST MODE FOR CARRYING OUT THE INVENTION

Embodiment 1

Figure 1:
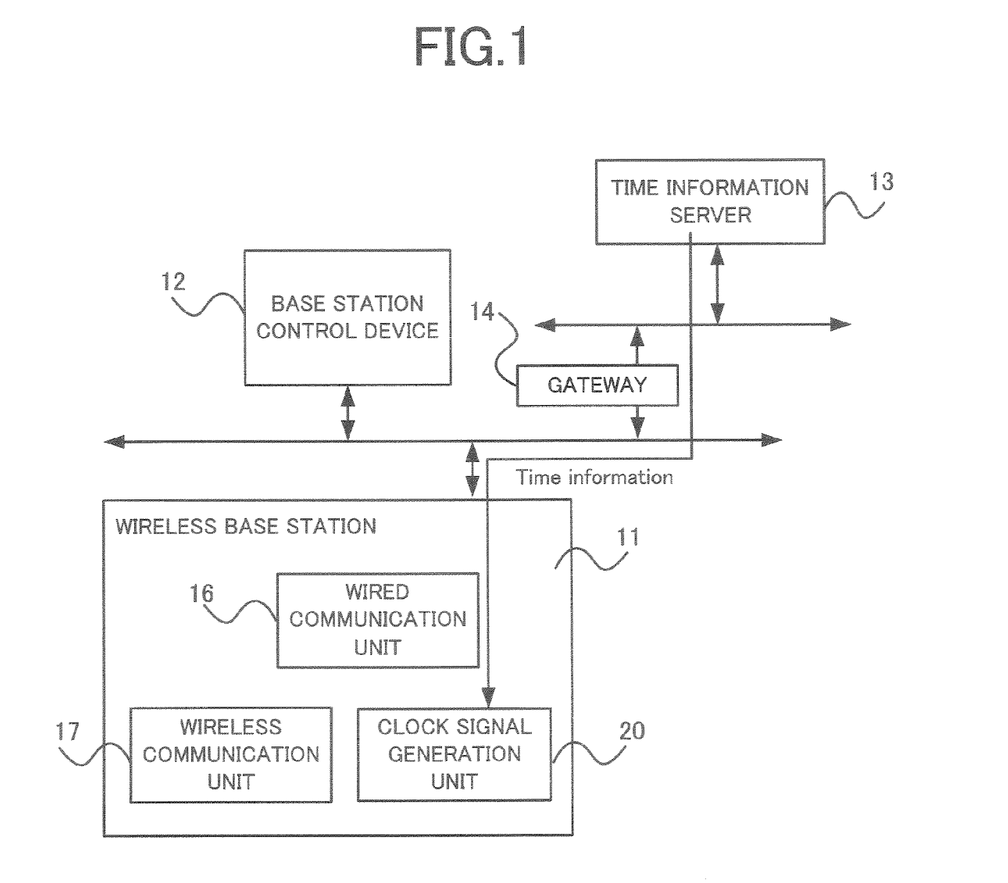
FIG. 1 is a diagram illustrating a configuration of communication networks relevant to Embodiment 1 of the present invention.

FIG. 1 is a diagram illustrating a configuration of communication networks relevant to Embodiment 1 of the present invention. A wireless base station 11 and a base station control device 12 are connected via the same communication network. A time information server 13 is connected to another communication network. The two communication networks are interconnected via a gateway 14.

The wireless base station 11 is, for example, a W-CDMA base station, and is a wireless communication device that performs wireless communication with a lower-level mobile communication terminal (not illustrated), and that performs wired communication with an upper-level base station control device 12 The base station control device 12 is, for example, a W-CDMA RNC (Radio Network Controller), and is a device that wiredly transmits signals from a further upper-level device to the wireless base station 11, wiredly transmits signals from the wireless base station 11 to the upper-level device, and controls the wireless base station 11. A time information server 13 is, for example, an NTP (Network Time Protocol) server, and is a device for supplying the current time to various clients (terminals) connected via communication networks. The gateway 14 is a device that connects different communication networks, and performs communication protocol conversion.

The wireless base station 11 includes a clock signal generation unit 20, a wired communication unit 16, and a wireless communication unit 17. The clock signal generation unit 20 corresponds to a clock signal generation device or a clock signal generation means in the present invention, and generates high-precision clock signals used in the wireless base station 11 The wired communication unit 16 is a wired interface for performing wired communication with the base station control device 12 or the time information server 13. The wireless communication unit 17 is a wireless interface for performing wireless communication with mobile communication terminals.

The wireless base station 11 can receive the current time supplied by the time information server 13 via the two communication networks and the gateway 14.

The time information server 13 may be connected to the same communication network to which the wireless base station 11 and the base station control device 12 are connected.

Figure 2:
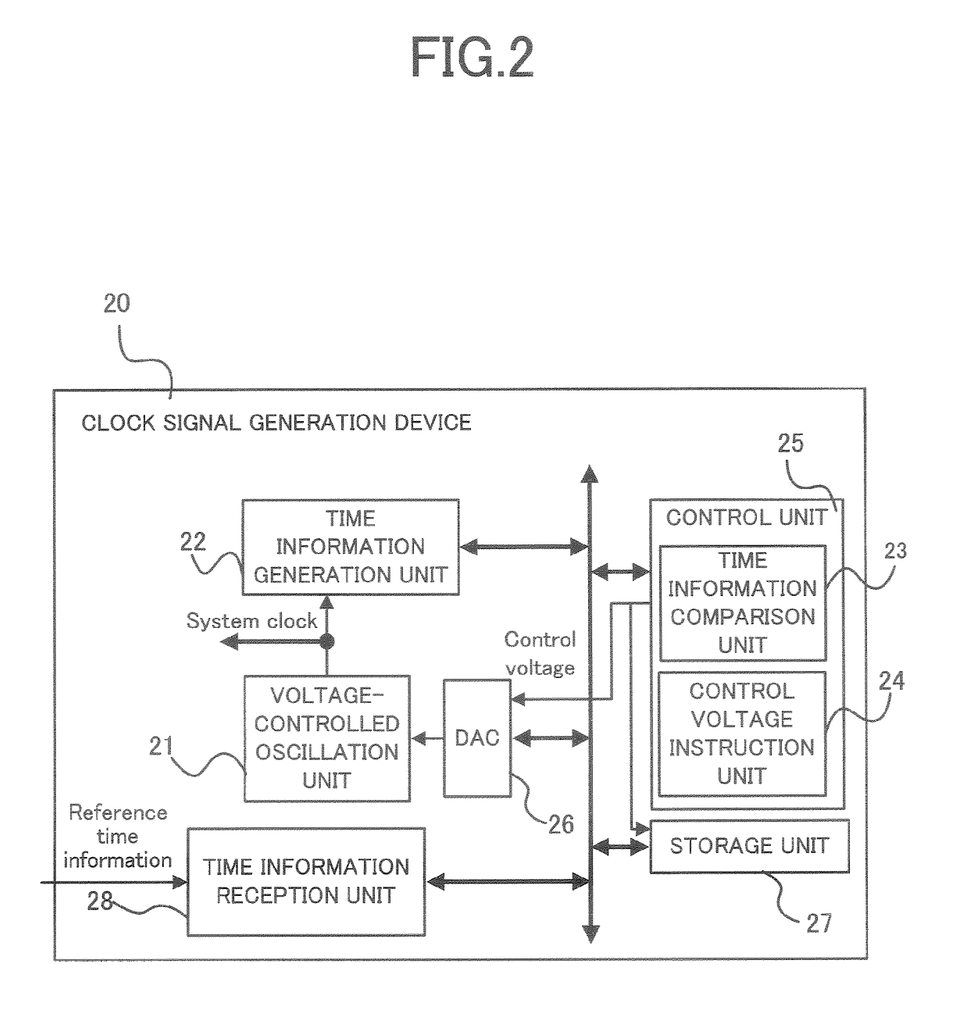
FIG. 2 is a diagram illustrating a detailed configuration of a clock signal generation unit.

FIG. 2 is a diagram illustrating a detailed configuration of the clock signal generation unit. The clock signal generation unit 20 includes a voltage-controlled oscillation unit (VCO) 21, a time information generation unit 22, a control unit 25, a DA conversion unit (DAC) 26, a storage unit 27, and a time information reception unit 28

The voltage-controlled oscillation unit 21 is a high precision oscillator that outputs a clock signal of an oscillating frequency in accordance with an inputted control voltage as a system clock used in the wireless base station 11. For example, a VC-OCXO (voltage-control oven controlled crystal oscillator) or a VC-DTCXO (voltage-control digital temperature compensated crystal oscillator) whose frequency precision is less than 0.05 ppm is used. In addition, the time information server 13 has a clock source better than the high precision oscillator by two orders of magnitude, or operates following the clock source. The time information generation unit 22 is, for example, a counter that divides the frequency of an inputted clock signal, and generates time information from the clock signal outputted by the voltage-controlled oscillation unit 21.

The control unit 25 includes a time information comparison unit 23 and a control voltage instruction unit 24. The time information comparison unit 23 compares time information generated by the time information generation unit 22 with reference time information. The control voltage instruction unit 24 instructs to the voltage-controlled oscillation unit 21 the control voltage according to the comparison result obtained by the time information comparison unit 23, such as the time information difference.

The DA conversion unit 26 is a converter for converting the control voltage signals that the control voltage instruction unit 24 instructs to the voltage-controlled oscillation unit 21 from digital signals into analog signals. The storage unit 27 is nonvolatile memory for storing control voltage data instructed by the control voltage instruction unit 24. Because stored data is not lost at power off, the data can be continuously used when restarting. The time information reception unit 28 receives the time information transmitted from the time information server 13 as reference time information.

Next, operations relevant to the present embodiment will be described

The wired communication unit 16 in the wireless base station 11 requests periodically (for example, the period is 56 hours) the time information server 13 accessible via the communication networks to supply time information. Alternatively, the wired communication unit requests periodical supply of time information. In addition, at the initial stage after power on, even though the wireless base station 11 obtains reference time information from the time information server 13, the reference time information is used as an initial value in the time information generation unit 22 without comparison in the time information comparison unit 23. The time information generation unit 22 starts counting clock signals from the initial value, and counts up gradually. After a predetermined time has elapsed, reference time information is obtained again from the time information server 13, and compared with time information generated by the time information generation unit 22 (hereinafter referred to as calendar information). The above-described operation is periodically repeated.

Figure 3:
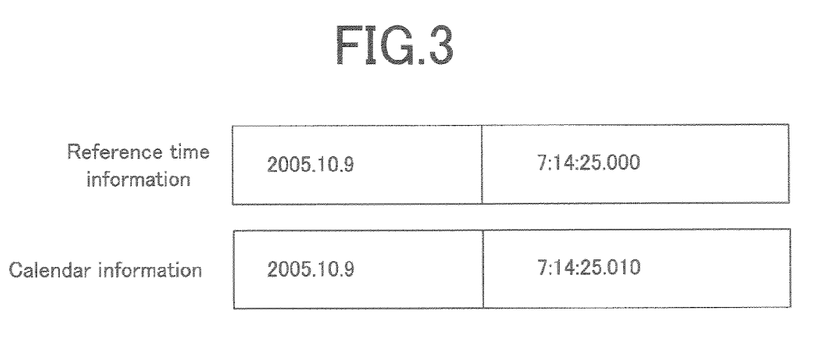
FIG. 3 is a diagram illustrating an example of reference time information and calendar information.

For example, when an NTP server is used as a time information server 13, time information up to the order of 1/1000 second is available. As exemplified in FIG. 3, given that "Reference time information: 2005.10.9 7:14:25.000" is obtained as reference time information, if the calendar information at the reference time is "Calendar information: 2005.10.9 7:14:25.010", these are compared. As a comparison result, the information that the calendar information is 10 milliseconds fast is obtained. It is assumed that "the clock frequency is fast by 0.01 ppm", so that a control voltage, for example, 0.005 V lower than the current control voltage is instructed via the DA conversion unit 26 to the voltage-controlled oscillation unit 21. The control voltage is instructed to the voltage-controlled oscillation unit 21, and is also stored in the storage unit 27. In the meantime, when the calendar information is 10 milliseconds late compared with the reference time information, it is assumed that "the clock frequency is late by 0.01 ppm", so that a control voltage, for example, 0.005 V higher voltage is instructed to the DA conversion unit 26. When the level of delay/leading of the calendar information with respect to the reference time information is small, and below the threshold for determining fast late, it is instructed to keep the current control voltage.

Figure 4:
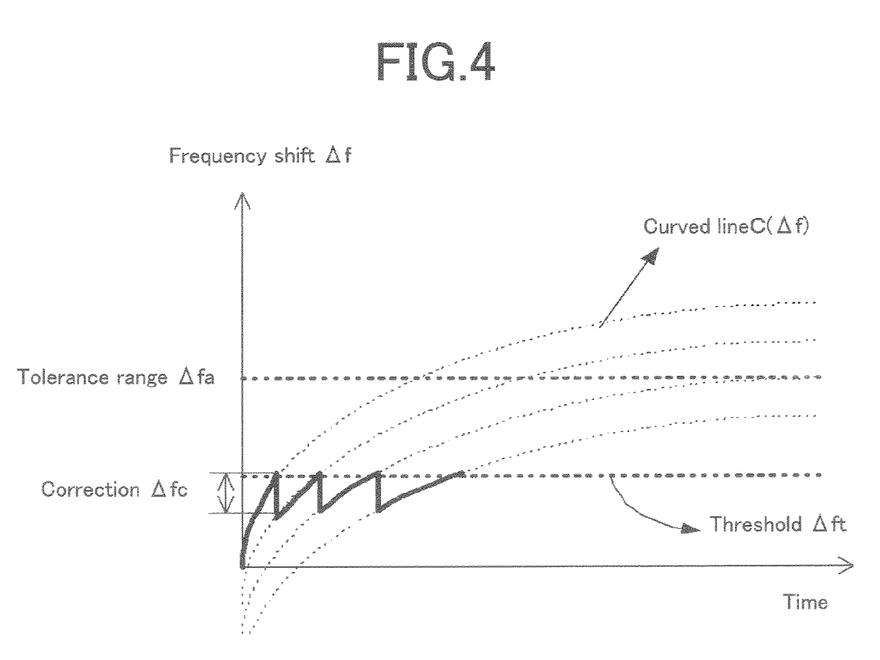
FIG. 4 is a diagram illustrating a first example of time variations of the frequency shift $\Delta f$.

FIG. 4 is a diagram illustrating a first example of time variations of the frequency shift Δf. According to the present embodiment, the frequency shift Δf of the voltage-controlled oscillation unit 21 varies with time as illustrated in FIG. 4. The voltage-controlled oscillation unit 21 is adjusted at the initial stage after power on, so that the oscillation is started with the frequency shift Δf=0 (in the case of the OCXO, after the thermostatic oven gets sufficiently warmed up, the frequency shift Δf becomes 0), and the frequency shift Δf gets large over time. Even though the voltage-controlled oscillation unit 21 is highly precise, if it is used continuingly without any correction of the oscillating frequency, the tolerance range Δfa is exceeded after a certain time has passed. The shorter the time required until the tolerance range Δfa is exceeded, the cheaper the oscillator. Generally, as for a highly precise oscillator, as illustrated in FIG. 4, the increase in the frequency shift Δf per unit time comes down over time.

Figure 5:
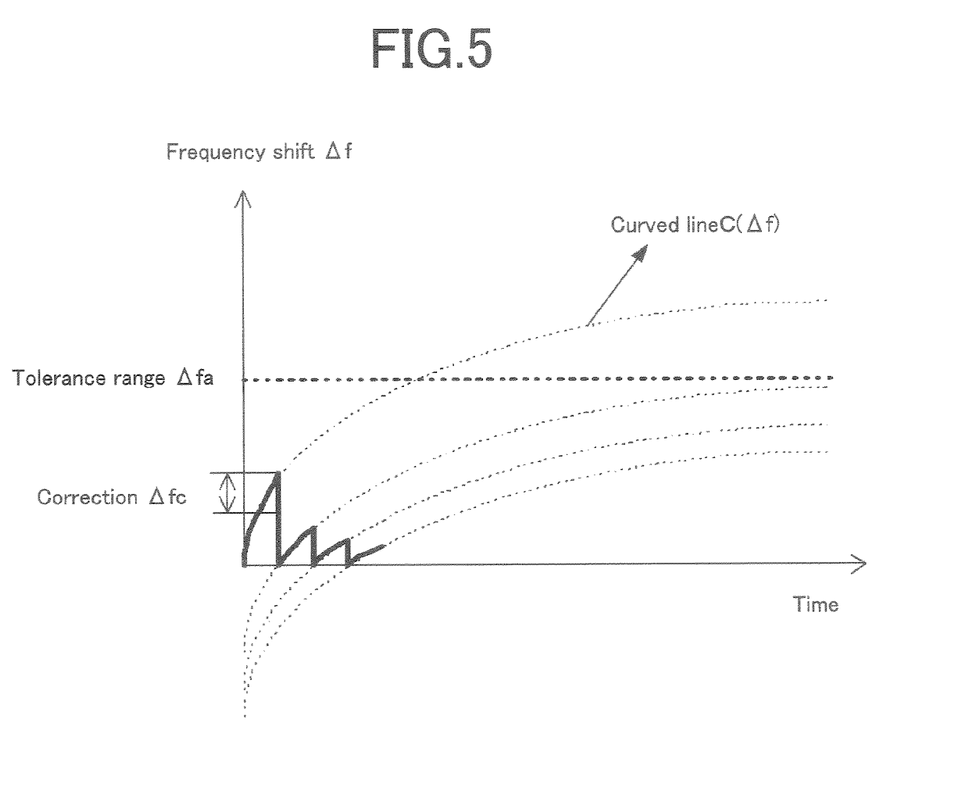
FIG. 5 is a diagram illustrating a second example of time variations of the frequency shift $\Delta f$.

For the above-described phenomenon, a frequency correction operation is performed as described in the present embodiment. For example, when the frequency shift Δf exceeds a predetermined threshold Δft, the control voltage is changed based on comparison of time information. The threshold Δft is set to be a value smaller than the tolerance range Δfa of the frequency shift Δf. According to that, when the calendar information is fast with respect to the reference time information, a new control voltage is instructed in such a way that the oscillating frequency decreases, and when the calendar information is late with respect to the reference time information, a new control voltage is instructed in such a way that the oscillating frequency increases. Possible values for the control voltage value are discrete voltage values that are equally spaced at the minimum voltage steps. A control voltage value that is shifted by the minimum voltage step is instructed in a single correction, so that the correction step Δfc illustrated in FIG. 5 is subtracted from the frequency shift Δf. Each time such a control voltage instruction is executed, the frequency shift Δf, while making the transition from its change curve C(Δf) to another change curve that is shifted downward from the change curve C(Δf) by a correction step Δfc, varies over time along each change curve. Accordingly, the frequency shift Δf never exceeds the tolerance range Δfa.

In the above description, a case in which the minimum voltage step is used is described. In a system in which the time difference between the reference time information that the time information reception unit 28 receives and the calendar information that the time information generation unit 22 generates is highly precise, it is also effective to always instruct a control voltage that will make the frequency shift Δf=0 to the voltage-controlled oscillation unit 21. A system in which the time difference between the reference time information and the calendar information is highly precise is, for example, a system in which fluctuation due to networks is small, or a system in which extremely long time averages can be obtained.

FIG. 5 is a diagram illustrating a second example of time variations of the frequency shift Δf. If the frequency shift Δf is periodically corrected, a correction is performed before the frequency shift Δf reaches the tolerance range Δa, and the correction period is determined to be the time until the first correction. The increasing rate of the frequency shift Δf decreases each time the correction is performed. Therefore, if such a period is adopted, the frequency shift Δf never exceeds the tolerance range Δfa henceforth. If the frequency correction is performed for that period, the voltage-controlled oscillation unit 21 starts its operation from the frequency shift Δf=0, and the correction is performed when the period of time has passed. In this case, as illustrated in FIG. 5, the correction step by a single correction may exceed the correction step Δfc. After that, if the frequency corrections are performed periodically, the increasing rate of the frequency shift Δf gradually decreases.

As described above, according to the present embodiment, the oscillating frequency correction is performed by changing the control voltage periodically or each time the threshold Δft is exceeded, so that the oscillating frequency can be kept within the tolerance range for a long time with a simple configuration using a low-cost precise oscillator, and sufficient frequency stability can be assured. In particular, it is effective for a case in which a clock cannot be extracted through a line, or specifically for asynchronous networks such as Ethernet (registered mark).

In addition, although the control voltage instruction unit 24 can instruct the control voltage based on one comparison result obtained by the time information comparison unit 23, a plurality of comparison results is averaged, and the control voltage according to the averaging result can be instructed. For example, the time difference between the reference time information and the calendar information is periodically calculated, an average value is calculated for a sufficiently long time with respect to uncertainty in the calendar information, and the calculated average value is compared with the threshold Δft. Alternatively, a moving average value $(\Delta t_x + \Delta t_{x+1} + \ldots + \Delta t_{x+n-1})/n$ for n(=1, 2, ...) samples is used as an average value. When the average value gets larger than the threshold Δft, the control voltage is changed to perform frequency correction. This can compensate fluctuations so that the oscillating frequency can be kept more precisely.

Moreover, although the control voltage instruction unit 24 can adopt every value of one comparison result obtained by the time information comparison unit 23 or averaging results based on an above-described plurality of comparison results to instruct the control voltage, out of the comparison results or averaging results, some results that deviate from predetermined conditions such as predicted comparison results or averaging results can be excluded. This can exclude inappropriate data that obstructs maintenance of the frequency precision, so that the oscillating frequency precision can be further enhanced.

Furthermore, although in the above the control voltage of the voltage-controlled oscillation unit 21 is automatically changed based on the instruction of the control voltage by the control voltage instruction unit 24, by configuring the voltage-controlled oscillation unit 21 to oscillate according to a set voltage that can be set manually, a set voltage notification unit for notifying an operator of the set voltage can be used instead of the control voltage instruction unit 41. According to that, it is possible to request the operator to adjust the oscillating frequency.

Embodiment 2

Figure 6:
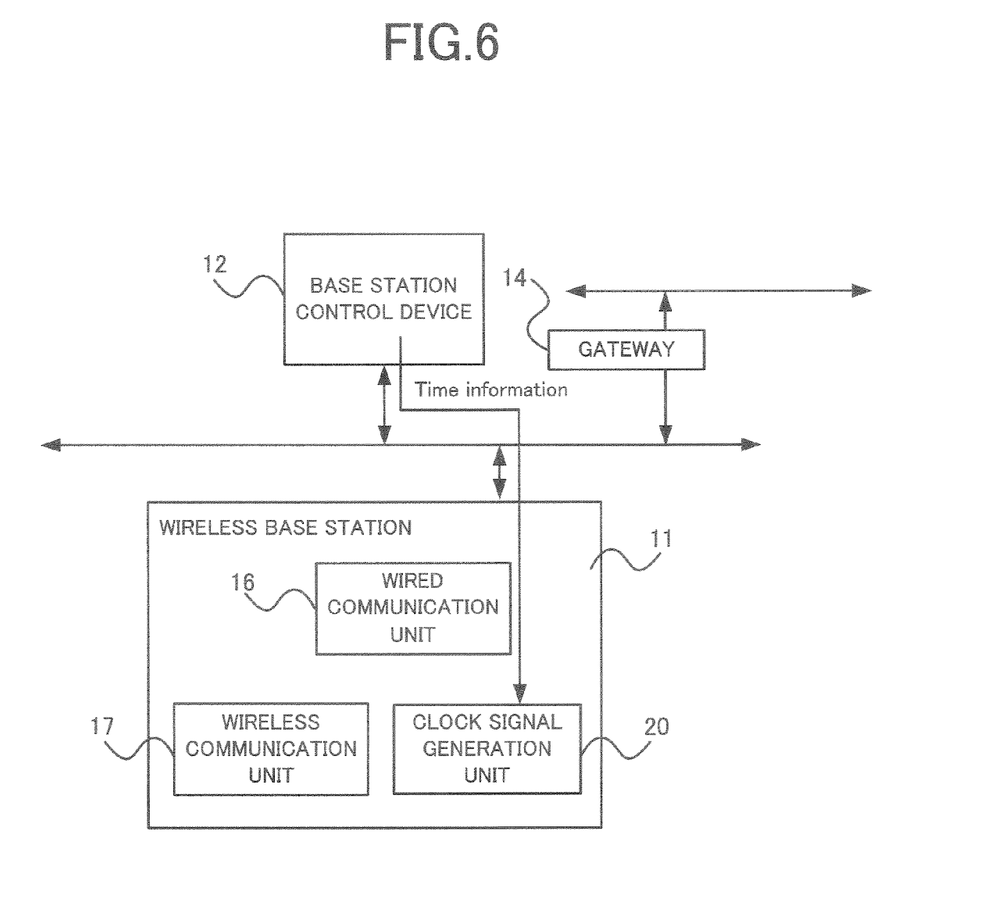
FIG. 6 is a diagram illustrating a configuration of communication networks relevant to Embodiment 2 of the present invention.

FIG. 6 is a diagram illustrating a configuration of communication networks relevant to Embodiment 2 of the present invention. In Embodiment 1, the time information server 13 supplies the reference time information In the meantime, in Embodiment 2, the base station control device 12 supplies the reference time information instead of the time information server 13. In this case, the base station control device 12 has a clock source better than the clock signal generated by the clock signal generation unit 20 of the wireless base station 11 by two orders of magnitude, or operates following such a clock source. For example, in a W-CDMA mobile communication system, data can be transmitted at a constant frequency from the base station control device 12 to the wireless base station 11. Node Synchronization described in Non-patent document 3 (3GPP TS 25.427) or Non-patent document 4 (3GPP TS 25.435) is one example, and time stamp information of the granurality 0.125 ms, referred to as an RFN (RNC Frame Number), can be transmitted from the base station control device 12 toward the wireless base station 11. The information is transmitted from the base station control device 12 to the wireless base station 11 at a constant frequency, and is compared in the wireless base station 11 with a BFN (Node B Frame Number) that is timing information of the wireless base station 11 and corresponds to calendar information. For example, the arrival interval of Node Synchronization is calculated. According to that, the wireless base station 11 can determine whether the clock frequency of its own is fast or slow. If it is determined that the clock frequency is fast, the control voltage is instructed to decrease the frequency. If it is determined that the clock frequency is slow, the control voltage is instructed to increase the frequency. If it is determined as neither of those, the control voltage is instructed to keep the current frequency.

As described above, in the present embodiment, by comparing the reference time information supplied from the base station control device 12 with the calendar information, a further simple configuration can be achieved, and the oscillating frequency of the clock signal generation unit 20 can be precisely kept.

Embodiment 3

Figure 7:
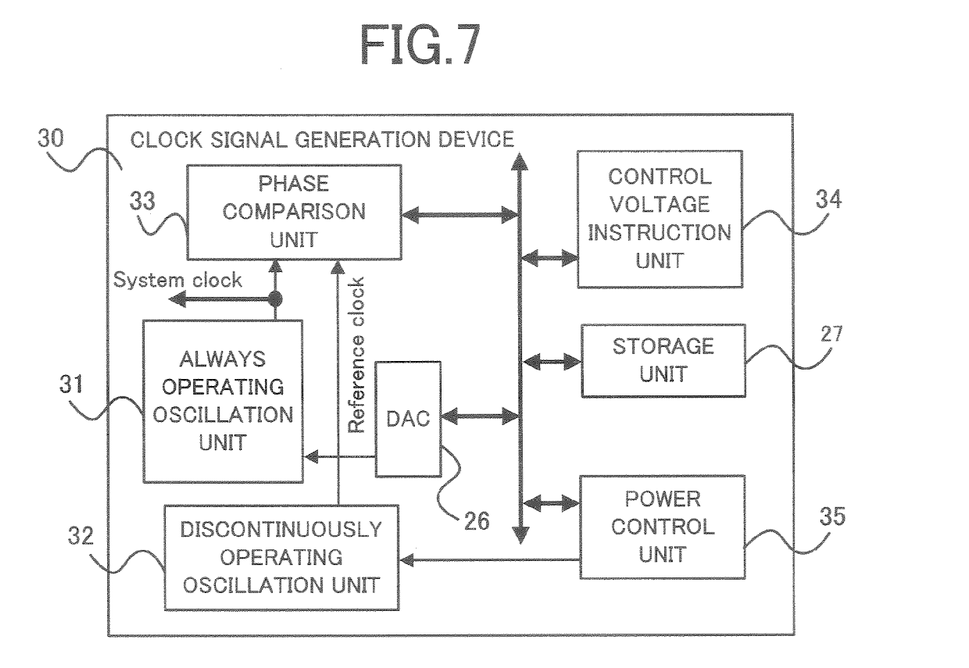
FIG. 7 is a diagram illustrating a configuration of a clock signal generation unit relevant to Embodiment 3 of the present invention.

FIG. 7 is a diagram illustrating a detailed configuration of a clock signal generation unit relevant to Embodiment 3 of the present invention. In the present Embodiment 3, the clock signal generation unit 20 in Embodiment 1 (FIG. 2) is replaced with a clock signal generation unit 30 (FIG. 7). The clock signal generation unit 30 includes an always operating oscillation unit 31, a discontinuously operating oscillation unit 32, a phase comparison unit 33, a control voltage instruction unit 34, and a power control unit 35, in addition to a DA conversion unit 26 and a storage unit 27. The DA conversion unit 26 and the storage unit 27 are the same as those in Embodiment 1 (FIG. 2).

The always operating oscillation unit 31 is the same as the voltage-controlled oscillation unit 21 in Embodiment 1 (FIG. 2), and operates at all times. The discontinuously operating oscillation unit 32 is a high precision oscillator such as an OCXO (oven-controlled crystal oscillator), and can be switched between operating/non-operating states by the power control unit 35 power on/off control. The phase comparison unit 33 compares the clock signal outputted from the always operating oscillation unit 31 with the reference clock signal outputted from the discontinuously operating oscillation unit 32, and outputs the difference as a comparison result. The voltage control instruction unit 34 instructs the control voltage according to the comparison result by the phase comparison unit 33 via the DA conversion unit 26 to the always operating oscillation unit 31, and stores the control voltage value in the storage unit 27 (in the case of an OCXO, the control voltage after the thermostatic oven gets sufficiently warmed up is used). In addition to that, the voltage control instruction unit 34 instructs power on/off timing to the power control unit 35. The power control unit 35 is a control circuit for on/off-controlling the power of the discontinuously operating oscillation unit 32.

Among these, the always operating oscillation unit 31, the phase comparison unit 33, the control voltage instruction unit 34, and the DA conversion unit 26 use the clock signal from the discontinuously operating oscillation unit 32 as a reference clock signal, and constitute a PLL (phase-locked loop) circuit for generating the system clock in the wireless base station.

In a clock signal generation unit 30 with such a configuration, the power of the discontinuously operating oscillation unit 32 is usually off, and when oscillating frequency correction by the always operating oscillation unit 31 is needed, the power of the discontinuously operating oscillation unit 32 is turned on. Because of evaporation of moisture in the crystal or other reasons, aging variation of the oscillating frequency of the discontinuously operating oscillation unit 32 progresses during power-on periods. Therefore, progress of the aging variation can be suppressed by performing power on/off control. For this reason, the oscillating frequency of the discontinuously operating oscillation unit 32 keeps high precision compared with the oscillating frequency of the always operating oscillation unit 31.

Accordingly, in the present Embodiment 3, although two high precision oscillators are required, without receiving a reference clock signal or reference time information from other devices, high precision in the oscillating frequency can be kept for a long period of time.

In addition, the always operating oscillation unit 31 and the discontinuously operating oscillation unit 32 are mounted typically on the same circuit board, and requires individual power sources. However, they can be mounted on individual circuit boards. More specifically, on a circuit board on which the always operating oscillation unit 31 is mounted, a power source for always driving the entire circuit board can be provided. In the same manner, on a circuit board on which the discontinuously operating oscillation unit 32 is mounted, a power source for discontinuously driving the entire circuit board can be provided.

Moreover, the clock signal generation unit 30 can be redundantly configured. More specifically, a discontinuously operating oscillating unit that is a replacement for the always operating oscillation unit 31 for outputting the system clock, the phase comparison unit 33, the control voltage instruction unit 34, the power control unit 35, the DA conversion unit 26, and the storage unit 27 are doubled. While switching an operating system and a waiting system, a clock signal outputted from the oscillating unit in the waiting system is used as a reference clock signal in the operating system. With such a configuration, high precision in the oscillating frequency can be kept for a long period of time.

Furthermore, although in the above the control voltage of the always operating oscillation unit 31 is automatically changed according to the instruction of the control voltage by the control voltage instruction unit 34, by configuring the always operating oscillation unit 31 to oscillate according to a set voltage that can be set manually, a set voltage notification unit for notifying an operator of the set voltage can be used instead of the control voltage instruction unit 34. This can request an operator to adjust the oscillating frequency.

Alternatively, the above-described function for frequency correction can be activated from an operation center.

Embodiment 4

Figure 8:
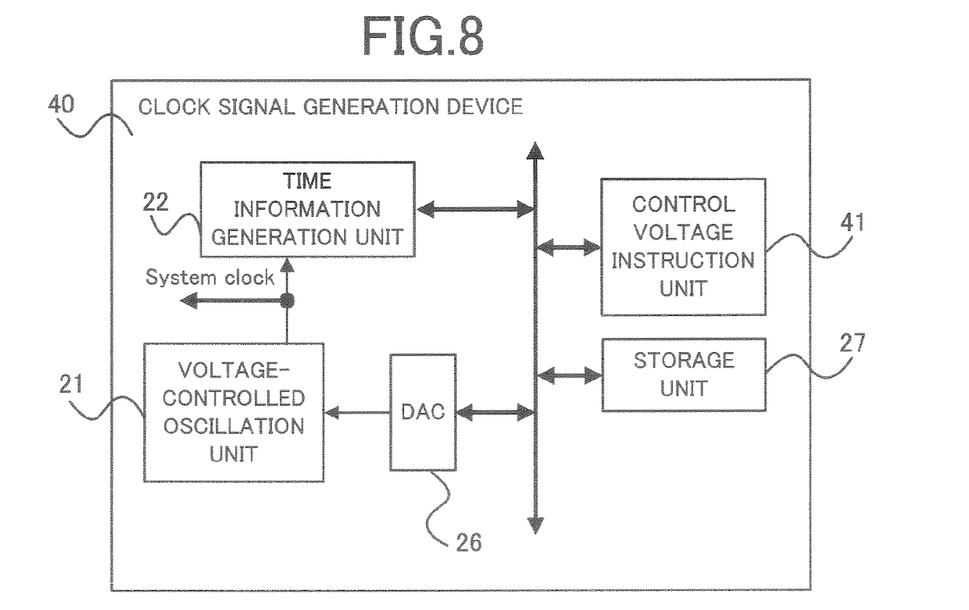
FIG. 8 is a diagram illustrating a configuration of a clock signal generation unit relevant to Embodiment 4 of the present invention.

FIG. 8 is a diagram illustrating a detailed configuration of a clock signal generation unit relevant to Embodiment 4 of the present invention. In the present Embodiment 4, the clock signal generation unit 20 in Embodiment 1 (FIG. 2) is replaced with a clock signal generation unit 40 (FIG. 8). The clock signal generation unit 40 includes a control voltage instruction unit 41 in addition to a voltage-controlled oscillation unit 21, a time information generation unit 22, a DA conversion unit 26, and a storage unit 27.

The time information generation unit 22 generates and outputs the current time given that the time is zero when the power source of the voltage-controlled oscillation unit 21 is turned on, or more specifically, total hours from the time the power source is turned on. Based on data that aging variation of the oscillating frequency of the voltage-controlled oscillation unit 21 is predicted, the control voltages for outputting the accurate oscillating frequency are calculated for each time or total hours, and the relation between the calculated oscillating frequency and the control voltage is stored in the storage unit 27. The control voltage instruction unit 41 instructs a control voltage according to a desired oscillating frequency from the relation between the oscillating frequency corresponding to the time (total hours) information generated by the time information generation unit 22 and the control voltage. Alternatively, data that aging variation of the oscillating frequency is predicted is stored in the storage unit 27, so that the control voltage instruction unit 41 can calculate a required control voltage.

The prediction data of the oscillating frequency is collected in the following manner, for example. Firstly, the oscillating frequency of a sample oscillator with the same configuration as the voltage-controlled oscillation unit 21 is measured when a long time such as two or three years has passed. In the meantime, performance transition during a period around two weeks to one month is measured before an actual operation for an actual oscillator used as a voltage-controlled oscillation unit 21. Based on the measurement data, the subsequent prediction data is statistically reasoned by analogy. Generally, after a certain period of time has passed, the oscillating frequency of a crystal monotonically increases or decreases as moisture in the crystal evaporates. By approximate the predicted frequency values by a simple formula for computation such as linear approximation or quadratic curve (parabolic curve) approximation, it is only necessary for estimation to store a slight amount of time-discrete data in the storage unit 27.

Therefore, in the present Embodiment 4, by storing in the storage unit 27 information indicating the relation between the oscillating frequency and the control voltage of the voltage-controlled oscillation unit 21 that varies across the ages, the clock signal generation unit can be configured further simply, and the oscillating frequency can be kept highly precisely.

In addition, although a configuration of the time information generation unit 22 in which output clock signals from the voltage-controlled oscillation unit 21 are counted has been described, it is only necessary to measure the power-on total hours with tolerance of around one month, so that as described in Embodiment 2, time stamp information transmitted from the base station control device can be used, or a relatively lower precision clock signal for driving processors such as a CPU (central processing unit) can be used instead.

Moreover, it is also effective to add a temperature measuring IC (integrated circuit) for measuring the temperature around the voltage-controlled oscillation unit 21, and to store correction data depending on the temperature in the storage unit 27. The ambient temperature is measured by the temperature measuring IC, correction data according to the measured temperature is read out from the storage unit 27, and aging variation and temperature variation are considered when instructing the control voltage. Accordingly, temperature compensation is also made possible.

Furthermore, although in the above the control voltage of the voltage-controlled oscillation unit 21 is automatically changed based on the instruction of the control voltage by the control voltage instruction unit 41, by configuring the voltage-controlled oscillation unit 21 to oscillate according to a set voltage that can be set manually, a set voltage notification unit for notifying an operator of the set voltage can be used instead of the control voltage instruction unit 41. This can request an operator to adjust the oscillating frequency. In this case, notification of the set voltage is realized in such a way that the time when the controllable range by a VC (voltage control) terminal of the voltage-controlled oscillation unit 21 is exceeded to be out of the standard is calculated from the prediction data, and when that time has passed, an LED (light emitting diode) is turned on, or an alarm signal is transmitted to the operation center connected to the clock signal generation device 40. In addition, when an alarm signal is transmitted to the operation center, before an abnormal operation occurs, an operator can be requested manually or by the control from the operation center to adjust the oscillating frequency.

Embodiment 5

Figure 9:
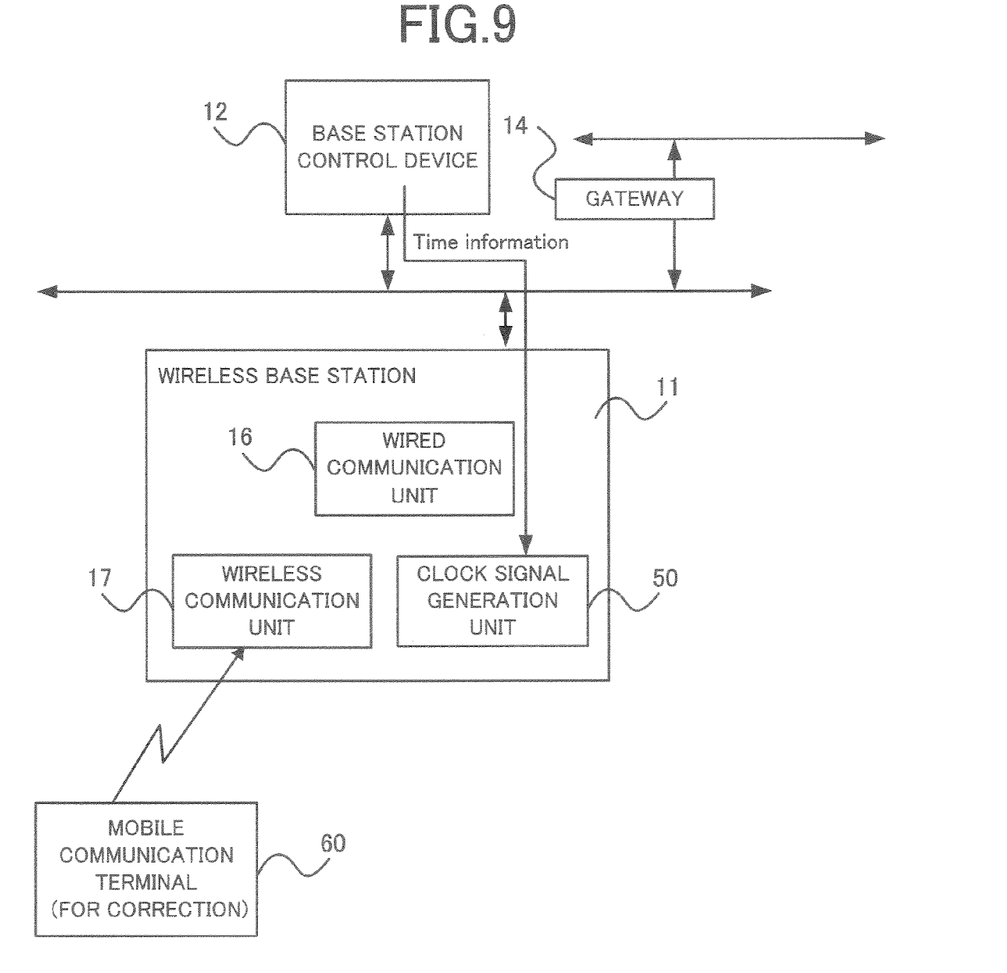
FIG. 9 is a diagram illustrating a configuration of communication networks relevant to Embodiment 5 of the present invention.

FIG. 9 is a diagram illustrating a configuration of a communication network relevant to Embodiment 5 of the present invention. In the present Embodiment 5, based on Embodiment 1 (FIG. 1), a mobile communication terminal 60 is added instead of the time information server 13, and the clock signal generation unit 10 is replaced with a clock signal generation unit 50 (described later in FIG. 10). The mobile communication terminal 60, which is a terminal exclusively for frequency correction and includes a GPS receiver, a high stability oscillating source such as a rubidium oscillator, or a wave clock receiver, transmits a clock signal or time information via a wireless channel to the wireless base station 11.

Figure 10:
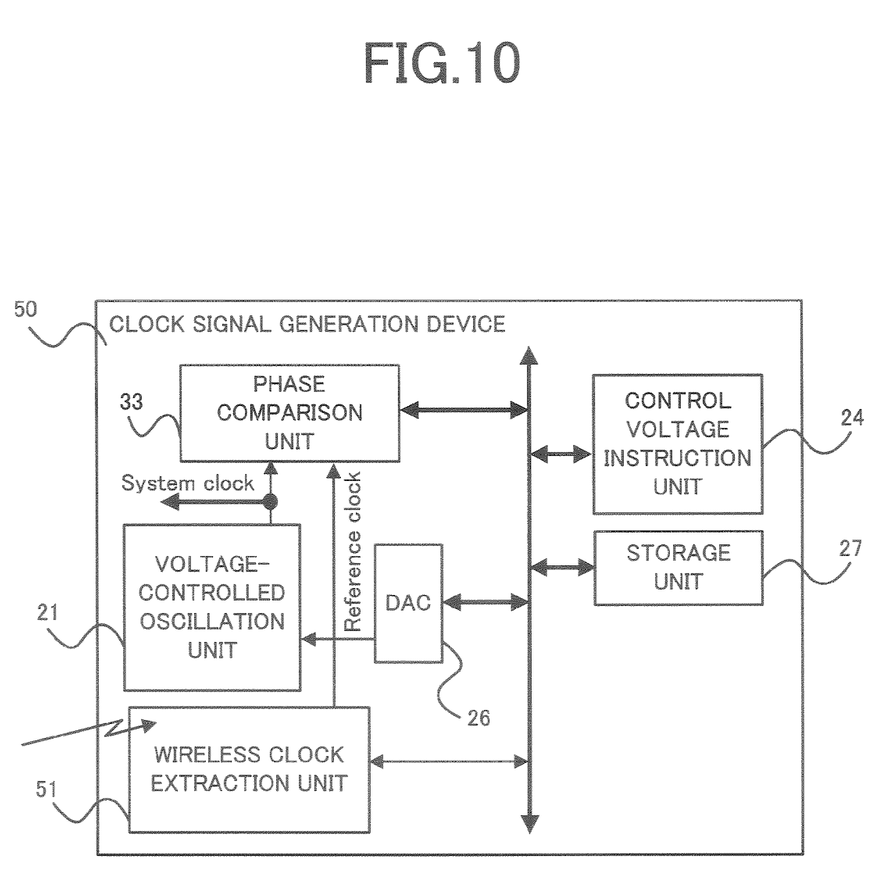
FIG. 10 is a diagram illustrating a detailed configuration of a clock signal generation unit.

FIG. 10 is a diagram illustrating a detailed configuration of the clock signal generation unit. The clock signal generation unit 50 includes a wireless clock extraction unit 51 in addition to a voltage-controlled oscillation unit 21, a control voltage instruction unit 24, a DA conversion unit 26, a storage unit 27, and a phase comparison unit 33. The voltage-controlled oscillation unit 21, the control voltage instruction unit 24, the DA conversion unit 26 and the storage unit 27 are the same as those in Embodiment 1 (FIG. 2). The phase comparison unit 33 is the same as that in Embodiment 3 (FIG. 7). The wireless clock extraction unit 51 extracts a clock signal from a signal that the wireless communication unit 17 in the wireless base station 11 has received from the mobile communication terminal 60. Among these components, the voltage-controlled oscillation unit 21, the phase comparison unit 33, the control voltage instruction unit 24, and the DA conversion unit 26 constitute a PLL circuit for outputting a system clock.

The wireless signal including the clock signal from the mobile communication terminal 60 is received by the wireless communication unit 17 in the wireless base station 11. The received signal is transferred to the wireless clock extraction unit 51 in the clock signal generation unit 50, where a clock signal or time information is extracted. The extracted clock signal or the time information is outputted as a reference clock signal for the PLL circuit. Using the reference clock signal received via a wireless channel as described above, the oscillating frequency of the voltage-controlled oscillation unit 21 can be corrected. In the case of time information, it is dealt in the same manner as the time information obtained from the NTP server in Embodiment 1.

As described above, in Embodiment 5, using a mobile communication terminal 60 exclusively for frequency correction, the frequency can be kept in high precision with a simple configuration.

What is claimed is:

1. A clock signal generation device, comprising:
   a voltage-controlled oscillation unit that outputs a clock signal of an oscillating frequency according to an inputted control voltage;
   a time information generation unit that generates time information based on the clock signal outputted from the voltage-controlled oscillation unit;
   a time information comparison unit that compares the time information generated by the time information generation unit with reference time information;
   a control voltage instruction unit that instructs a control voltage, according to a comparison result provided by the time information comparison unit, to the voltage-controlled oscillation unit, when the comparison result exceeds a predetermined non-zero threshold, and instructs the voltage-controlled oscillation unit to keep an existing control voltage when the comparison result is between zero and the predetermined non-zero threshold; and
   an aging-variation information storage unit that stores a first relation between variations of the oscillating frequency over time and the control voltage, wherein
   the control voltage instruction unit periodically updates the oscillating frequency based on the stored relation between variations of the oscillating frequency over time and the control voltage,
   the aging-variation information storage stores a second relation between variations of the oscillating frequency over time and a set voltage, the set voltage being externally set to update the control voltage, and
   a notification unit notifies the set voltage when a predetermined time has passed and requests a correction to the set voltage to update the oscillating frequency.

2. A clock signal generation device according to claim 1, wherein the reference time is supplied from a time information server connected via a communication network.

3. A clock signal generation device according to claim 1, wherein the control voltage instruction unit averages a plurality of comparison results provided by the time information comparison unit, and instructs a control voltage according to an averaged result obtained by the averaging, to the voltage-controlled oscillation unit, when the averaged result exceeds the predetermined non-zero threshold.

4. A clock signal generation device according to claim 3, wherein the control voltage instruction unit excludes inappropriate averaged results that obstruct maintenance of an oscillating frequency precision.

5. A clock signal generation device according to claim 1, wherein the control voltage instruction unit excludes inappropriate comparison results that obstruct maintenance of an oscillating frequency precision.

6. A wireless base station comprising:
   a clock signal generation unit that generates a clock signal; and
   a wireless communication unit that performs wireless communication with a mobile communication terminal using the clock signal generated by the clock signal generation unit;
   wherein the clock signal generation unit is a clock signal generation device according to claim 1.

7. A wireless base station, comprising:
   a clock signal generation unit that generates a clock signal; and
   a wireless communication unit that performs mobile communication with a mobile communication terminal using the clock signal generated by the clock signal generation unit, the clock signal generation unit including,
   a voltage-controlled oscillation unit that outputs a clock signal of an oscillating frequency according to an inputted control voltage;
   a phase comparison unit that compares a phase of the clock signal outputted from the voltage-controlled oscillation unit with a phase of a reference clock signal received from a mobile communication terminal that can supply a clock signal;
   a control voltage instruction unit that instructs a control voltage, according to a comparison result provided by the phase comparison unit, to the voltage-controlled oscillation unit; when the comparison result exceeds a predetermined non-zero threshold, and instructs the voltage-controlled oscillation unit to keep an existing control voltage when the comparison result is between zero and the predetermined non-zero threshold; and
   an aging-variation information storage unit that stores a first relation between variations of the oscillating frequency over time and the control voltage, wherein
   the control voltage instruction unit periodically updates the oscillating frequency based on the stored relation between variations of the oscillating frequency over time and the control voltage,
   the aging-variation information storage stores a second relation between variations of the oscillating frequency over time and a set voltage, the set voltage being externally set to update the control voltage, and
   a notification unit notifies the set voltage when a predetermined time has passed and requests a correction to the set voltage to update the oscillating frequency.

* * * * *